(12) United States Patent
Nomura et al.

(10) Patent No.: US 8,021,761 B2
(45) Date of Patent: Sep. 20, 2011

(54) PLATING MEMBER

(75) Inventors: Takashi Nomura, Toyota (JP); Mitsuru Sakano, Toyota (JP)

(73) Assignee: Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 12/441,847

(22) PCT Filed: Dec. 28, 2007

(86) PCT No.: PCT/JP2007/075428
§ 371 (c)(1),
(2), (4) Date: Mar. 18, 2009

(87) PCT Pub. No.: WO2008/082004
PCT Pub. Date: Jul. 10, 2008

(65) Prior Publication Data
US 2010/0040899 A1 Feb. 18, 2010

(30) Foreign Application Priority Data
Jan. 4, 2007 (JP) ................. 2007-000226

(51) Int. Cl.
*B32B 7/02* (2006.01)
*B32B 15/01* (2006.01)
*B32B 15/04* (2006.01)
(52) U.S. Cl. ........ 428/557; 428/646; 428/566; 428/610; 428/213; 428/218
(58) Field of Classification Search ................. 428/557, 428/646, 647, 648, 566, 600, 610, 613, 615, 428/674, 213, 218, 935
See application file for complete search history.

(56) References Cited

U.S. PATENT DOCUMENTS
2003/0003320 A1  1/2003  Matsuo et al.
2006/0071335 A1*  4/2006  Kotaki et al. ................. 257/750

FOREIGN PATENT DOCUMENTS
| JP | 10-102279 A | 4/1998 |
| JP | 2000-174191 A | 6/2000 |
| JP | 2001-053211 A | 2/2001 |
| JP | 2003-082500 A | 3/2003 |
| JP | 2003-147580 | * 5/2003 |
| JP | 2004-128399 A | 4/2004 |
| JP | 2005-086158 A | 3/2005 |
| JP | 2006-100402 A | 4/2006 |
| JP | 2007-154260 A | 6/2007 |

OTHER PUBLICATIONS
Machine Translation, Hige et al., JP 2003-147580, May 2003.*

* cited by examiner

*Primary Examiner* — Michael La Villa
(74) *Attorney, Agent, or Firm* — Sughrue Mion, PLLC

(57) ABSTRACT

A plating member comprising a lead-free plating material is obtained by the present invention in a manner such that whisker formation on a plating layer 16 of the plating member can be suppressed and thus the plating member has good solderability. In the case of such plating member having, on the surface of a base material 15, a plating layer 16 comprising a lead-free material (Sn—Cu alloy, etc.), the plating layer 16 has a layer structure of two or more layers (a1 to a3), the average particle diameter of plating particles (P1 to P3) constituting each layer varies from layer to layer, and the plating particle volume fraction of the plating layer 16 is 80% to 90% when the proportion of plating particles occupying a unit volume is defined as a plating particle volume fraction of 100% on the assumption that a unit volume 20 is filled with plating particles P3 each having the maximum average particle diameter.

4 Claims, 3 Drawing Sheets

(a)

(b)

PLATING MEMBER

TECHNICAL FIELD

The present invention relates to a plating member and a process for producing the same. In particular, the present invention relates to a plating member having a plating layer on the surface thereof, such as an external terminal for an electronic component such as a semiconductor device having an IC-chip-mounted lead frame, and it also relates to a process for producing the same.

BACKGROUND ART

For electronic components such as semiconductor devices, copper, copper alloy, 42 alloy, and the like are used for base materials for external terminals. Oxidation occurs on the surface of a terminal made of such a base metal. This might cause conduction failures due to soldering failures and the like. Therefore, in general, oxidation is prevented by forming a protective layer (plating layer) on the terminal surface by plating or the like.

In a case in which a tin alloy or a zinc alloy is used as a material for a plating layer, an alloy containing lead has been conventionally used. In recent years, in view of the reduction in environmental burdens, lead-free preparation has been required. As a plating layer material used for the above terminal, materials containing no lead, such as Sn, and Sn—Cu, Sn—Bi, and Sn—Ag alloys, have been used. However, when the surface of a terminal provided to an electronic component is subjected to plating processing with a lead-free material, whiskers, which are needle monocrystals of tin (Sn) or the like, are formed on a plating layer.

In recent years, for example, electronic components such as semiconductor devices having IC-chip-mounted lead frames are required to be further downsized. As a result, inter-terminal intervals have been narrowed down to approximately several hundred micrometers. Whiskers described above grow to a length of several hundreds of micrometers in some cases. Thus, in a case in which the inter-terminal interval is as narrow as several hundred micrometers as described above, an inter-terminal short circuit might be created as a result of whisker formation. Therefore, it is necessary to take measures to suppress whisker formation.

Many suggestions have been made regarding such measures. For instance, Patent Document 1 describes that whisker formation on a plating layer can be suppressed in the following manner. Upon formation of a lead-free Sn plating layer on the surface of a lead base material constituting an external terminal of an electronic component, the size of crystal particles constituting the plating layer is increased such that the grain boundary size per unit volume in the plating layer is decreased to become as small as possible.

In addition, Patent Document 2 describes that whisker formation on a plating layer can be suppressed in the following manner. Upon formation of a plating layer containing, as a main constituent, Sn on the external terminal surface, a low-melting-point alloy layer comprising Sn or an alloy of Sn and a different metal and a stress relief layer comprising a non-Sn single metal are alternately laminated to form a laminate having at least 3 layers.

[Patent Document 1] JP Patent Publication (Kokai) No. 2005-86158 A
[Patent Document 2] JP Patent Publication (Kokai) No. 2004-128399 A

DISCLOSURE OF THE INVENTION

Problem to be Solved by the Invention

However, it is difficult to say that sufficient effects are obtained by any conventionally proposed means or process for whisker suppression. In addition, in some cases, a process for obtaining a desired plating layer is complicated and/or sufficient solder wettability cannot be obtained, although whisker formation can be suppressed. In terms of application for actual electronic components, there are still some points to be improved.

The present invention has been realized in consideration of the above matters. It is an objective of the present invention to provide a novel plating member having a desired plating layer that comprises a lead-free material and can be easily formed on the base material surface such that the formed plating layer is satisfactory in terms of whisker suppression and good solder wettability, and to provide a process for producing the same.

Means for Solving Problem

In order to achieve the above objectives, the present inventors have conducted many experiments and studies of whiskers that are formed on plating layers comprising lead-free materials. Accordingly, they have found that a cause of whisker formation is an increase in internal stress in a plating layer, which is a main factor. Material factors and external factors cause an increase in internal stress. Material factors include compound generation due to diffusion of base material constituents and constituents used for plating and corrosion layer formation on the plating surface. In addition, external factors include stress remaining upon lead frame processing, linear expansion coefficient difference between a frame and a plating layer, and use environment (temperature, humidity, vibration, etc.).

Therefore, the present inventors thought that it would be possible to alleviate an increase in internal stress as described above by forming voids or pinholes in a plating layer, and thus they formed such a plating layer on the base material surface. As a result, it was confirmed that whisker formation can be suppressed even on a plating layer comprising a lead-free material. In addition, both whisker suppression and good solder wettability can be simultaneously achieved by adequately controlling the volumes of voids and pinholes that are present in a plating layer.

The present invention has been realized based on the above new findings and results confirmed in experiments obtained by the present inventors. The plating member of the present invention is a plating member having, on the base material surface thereof, a plating layer comprising a lead-free material, characterized in that the plating layer has a layer structure of two or more layers, that the average particle diameter of plating particles constituting each layer varies from layer to layer, and that the plating particle volume fraction of the plating layer is less than 100% when the proportion of plating particles occupying a unit volume is defined as a plating particle volume fraction of 100% on the assumption that a unit volume is filled with plating particles each having the maximum average particle diameter.

In the case of a plating member having the above structure, the plating particle volume fraction of a plating layer is determined to be less than 100%. Voids and pinholes exist inside the plating layer in proportions corresponding to differences from a plating particle volume fraction of 100%. Therefore, when some factors that cause an increase in internal stress are generated, formed voids and pinholes absorb such increase in internal stress. Accordingly, no significant increase in internal stress that causes whisker formation is substantially generated, resulting in suppression of whisker formation.

The plating member of the present invention is applied to an arbitrary location. However, it is preferably applied to an external terminal for an electronic component such as a semiconductor device having an IC-chip-mounted lead frame. In such case, copper alloy, 42 alloy, or the like is used for a base material constituting an external terminal. In addition, Sn, Zn, or an alloy comprising either thereof as a primary material is used as a lead-free material. Preferably, a plating material is pure Sn or an Sn alloy such as Sn—Cu, Sn—Bi, or Sn—Ag. In general, it is an Sn alloy containing Cu, Bi, or Ag (1% to 7%).

Preferably, the plating member of the present invention has a plating material volume fraction of 80% to 90%. As shown in the Examples below, when the plating material volume fraction is less than 80%, the criterion of a zero-crossing time of not more than 3 seconds might not be satisfied. Thus, satisfactory solder wettability cannot be obtained. In addition, in the case of a plating material volume fraction of more than 90%, whisker formation and growth cannot be sufficiently suppressed.

In the case of the plating member of the present invention, the magnitude correlation in terms of the average particle diameter of plating particles in each layer constituting the aforementioned structure of two or more layers is arbitrarily determined, provided that the following condition is satisfied: the plating particle volume fraction is less than 100%. When the average particle diameter of plating particles in each layer varies, the above plating particle volume fraction of each layer varies. In a layer formed with plating particles each having the maximum average particle diameter, the plating particle volume fraction reaches 100%.

With regard to the layer structure, the layer located farthest from the base material may be formed with plating particles each having the maximum average particle diameter, and layers located closer to the base material may be formed with plating particles having sequentially smaller average particle diameters, or vice versa. In addition, a plurality of layers each formed with plating particles having a different average particle diameter may be laminated in a random manner regardless of the magnitude of the average particle diameter. In particular, preferably, the layer located farthest from a base material has the structure of a layer formed with plating particles each having the maximum average particle diameter (a layer having a plating particle volume fraction of 100% as described above). This further ensures the realization of effects of suppressing whisker formation. In addition, solder wettability is improved.

The plating member of the present invention can be produced by a method wherein a base material is sequentially immersed into a plurality of plating solutions each containing plating particles having a different average particle diameter. In view of ease of production, it is preferable to employ an electrolytic plating method. In such case, the plating member of the present invention can be produced by performing electrolytic plating while changing the current value from the beginning to the end of electrolytic plating. Regarding the electrolytic plating method, it is known that there is a correlation between the current value and the particle size of plating particles to be electrodeposited. The larger the current, the smaller the particle size of plating particles to be electrodeposited. Thus, when the current value and time are adequately predetermined in an electrolytic plating method, it is possible to produce the plating member of the present invention, which has a layer structure of two or more layers each formed with plating particles having a different average particle diameter, provided that the total plating particle volume fraction of all plating layers is less than 100%. In such case, the current value varies preferably in a stepwise manner. However, the plating member can be produced even by causing the current value to continuously vary. When the current value is caused to vary in a stepwise manner, the welding time is substantially identical in each step.

According to the process for producing a plating member of the present invention, in a case in which the process involves an electrolytic plating method, the current value at the beginning of electrolytic plating is designated as the maximum current value and then electrolytic plating is carried out by decreasing the current value in a stepwise manner over the time course in a preferred embodiment. Consequently, it is possible to produce a plating member having: a layer located farthest from a base material, which is a layer formed with plating particles each having the maximum average particle diameter; and layers located closer to the base material, which are formed with plating particles having sequentially smaller average particle diameters.

According to the present invention, it is possible to obtain a novel plating member having a desired plating layer that comprises a lead-free material and can be easily formed on the base material surface such that the formed plating layer is satisfactory in terms of whisker suppression and good solder wettability.

EXPLANATION OF REFERENCE NUMERALS

10 . . . Semiconductor device; 11 . . . IC chip; 12 . . . Die pad; 13 . . . Lead frame; 14 . . . Sealing resin; 15 . . . External terminal; 16 . . . Plating layer; a1 to a3 . . . Layers constituting a plating layer; P1 to P3 . . . plating particles in a different layer; 17 . . . Void; 18 . . . Pinhole; and 20 . . . Unit volume

BEST MODE FOR CARRYING OUT THE INVENTION

Figure 1:
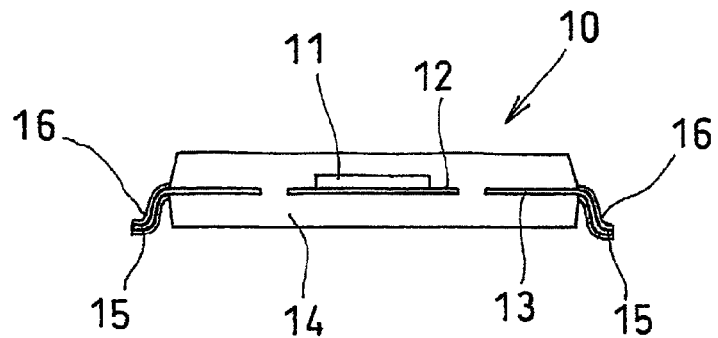
FIG. 1 shows an example in which the plating member of the present invention is applied to an external terminal of a semiconductor device, which is an example of an electronic component.
Figure 2:
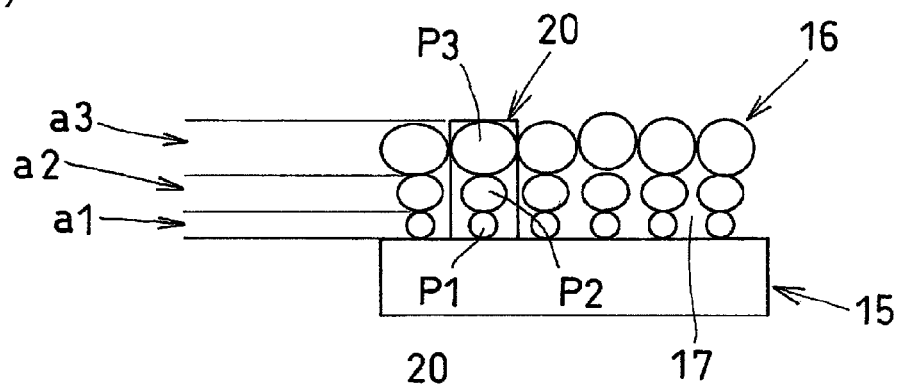
FIG. 2 schematically shows two examples of the plating member of the present invention.
Figure 2:
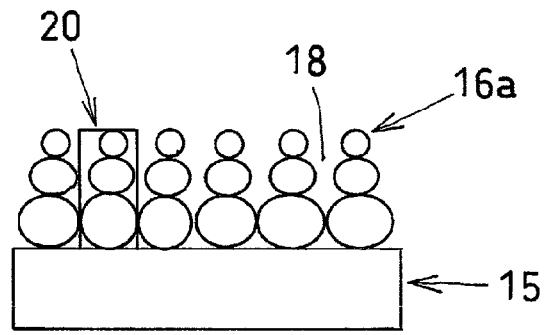
Figure 3:
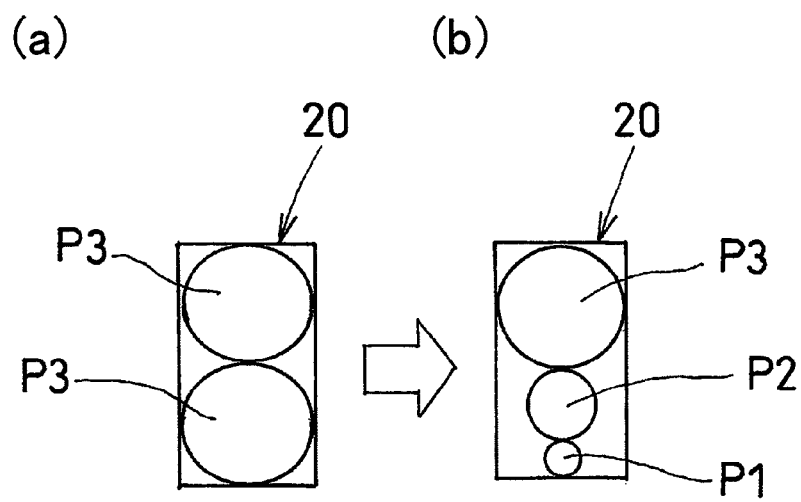
FIG. 3 is an explanatory drawing of "particle volume fraction" according to the present invention.

Embodiments of the present invention are described with reference to the figures. FIG. 1. shows an example in which the plating member of the present invention is applied to an external terminal of a semiconductor device, which is an example of an electronic component. FIG. 2. schematically shows two examples of the plating member of the present invention. FIG. 3. is an explanatory drawing of "particle volume fraction" according to the present invention.

In FIG. 1, the numeral "10" denotes a semiconductor device and the numeral "11" denotes an IC chip. An IC chip 11 is mounted on a lead frame 13 equipped with a die pad 12. The lead frame 13 is made of, for example, a copper alloy. The semiconductor device 10 is entirely covered with a sealing resin 14 such as epoxy or silicone. Each end portion of the lead frame 13 is exposed externally as an external terminal 15. The plating layer 16 of the present invention, which is made of a lead-free material, is formed on the surface of each external terminal 15 serving as a base material. The lead-free material may be either pure Sn or an Sn alloy such as Sn—Cu, Sn—Bi, or Sn—Ag. Alternatively, it may be zinc or a zinc-based alloy. The plating layer 16 may be formed by electrolytic plating or the like. In addition, the thickness of the plating layer 16 is approximately 5 to 15 μm.

As schematically shown in FIGS. 2(a) and 2(b), the plating layer 16 of the present invention has a layer structure of two or more layers (a 3-layer structure in the figures). The average particle diameter of plating particles constituting each layer varies from layer to layer. In this example, the layer a3 located farthest from the external terminal 15 serving as a base material is formed with plating particles P3 having the largest average particle diameter. The next layer a2 is formed with plating particles P2 having the second smallest average particle diameter. The layer a1, which is the bottom layer in contact with the external terminal 15, is formed with plating particles P1 having the smallest average particle diameter.

Further, the proportion of plating particles occupying a unit volume in each of layers a3, a2, and a1, that is to say, the plating particle volume fraction, varies from layer to layer. The layer a3 has the largest plating particle volume fraction. The next layer a2 has the second-largest plating particle volume fraction. The layer a1 serving as the bottom layer has the smallest plating particle volume fraction. Therefore, as shown in FIG. 2(a), when it is assumed that a unit volume 20 measured in the thickness direction of the plating layer 16 is extracted and the space for the extracted unit volume 20 is filled with plating particles P3 each having the maximum average particle diameter as shown in FIG. 3(a), the proportion of plating particles occupying the space corresponding to the unit volume 20 is defined as a plating particle volume fraction of 100%. In such case, in the plating layer 16, the proportion of plating particles occupying the space corresponding to the unit volume 20 is less than 100%. As a result, the layer a2 and the layer a1 each have void regions 17.

The plating layer 16 having such layer structure can be readily produced by, for example, an electrolytic plating method. According to the electrolytic plating method, the density of plating particles to be electrodeposited on the surface subjected to plating is proportional to the length of time that an electric current is applied. In addition, the size of plating particles to be electrodeposited is inversely proportional to the electric current magnitude. Further, in general, plating particles are preferentially electrodeposited on electrodeposited plating particles. Thus, the layer a1 is first formed by carrying out electrolytic plating at the largest current value for time t. The layer a2 is formed by carrying out electrolytic plating at a decreased current value for the substantially same time t. Then, the layer a3 is formed by carrying out electrolytic plating at a further decreased current value for the substantially same time t.

FIG. 2(b) schematically shows another embodiment of the plating member of the present invention. Herein, the layer structure of a plating layer 16a is a 3-layer structure as described above. However, the order of average particle diameter of plating particles in a different layer is inverse to that shown in FIG. 2(a). Also in this case, the plating particle volume fraction of the unit volume 20 in a plating layer 16a is less than 100%. As a result, the plating layer 16a has pinhole regions 18.

In such plating layers 16 and 16a, the void regions 17 or the pinhole regions 18 exist so as to absorb the aforementioned increase in internal stress. Accordingly, a significant increase in internal stress, which causes whisker formation, is not substantially generated inside the plating layers, resulting in suppression of whisker formation. In addition, particularly in the case of the plating layer 16 having the layer structure shown in FIG. 2(a), the uppermost layer a3 is substantially completely filled with plating particles P3, resulting in a lack of progression of surface oxidation. Thus, high plating wettability can be secured.

In addition, the layer structures of plating layers shown in FIGS. 2(a) and 2(b) are merely examples. There are many other varied examples. The layer structure may be composed of 4 layers or more. The sequence of layers having different plating particle volume fractions is not necessarily a gradated sequence of large-to-small or small-to-large, and instead it may be a random sequence.

EXAMPLES

Hereinafter, the present invention is described with reference to the Examples.

Example 1

A plating layer with a thickness of 12 μm comprising an Sn-3 wt % Cu material was formed on a test piece made of a copper alloy, which is generally used as an IC lead frame material, by an electrolytic plating method. Note that the current value was controlled at the 3 levels of high, medium, and low from the beginning to the end of the electrolytic plating. In addition, the "high" current value at the beginning of electrolytic plating was varied at 3 levels. The "medium" and "low" current values were varied in accordance with the high current values. As a result, three different plating members A, B, and C each having the layer structure schematically shown in FIG. 2(a) were obtained. Note that, each member was controlled to have an average particle diameter (maximum average particle diameter) of 8 μm in the layer a3.

Cross sections of plating members A, B, and C were observed with an FIB apparatus, followed by calculation. Thus, the total plating particle volume fraction of all plating layers and the average particle diameter in each of layers a1, a2, and a3 were obtained. Table 1 lists the results.

Further, a plating member D was prepared by carrying out electrolytic plating only at a "low" current value such that plating layers each having a uniform thickness and comprising plating particles having an average particle diameter of 8 μm were formed on the member. The plating member D had a plating particle volume fraction of 100%.

| Plating member | Plating particle volume fraction | Average particle size (layer a3) | Average particle size (layer a2) | Average particle size (layer a1) |
|---|---|---|---|---|
| A | 70% | 8 μm | 2.5 μm | 2 μm |
| B | 80% | 8 μm | 6 μm | 5.4 μm |
| C | 90% | 8 μm | 6.4 μm | 6 μm |
| D | 100% | 8 μm | 8 μm | 8 μm |

Example 2

Figure 4:
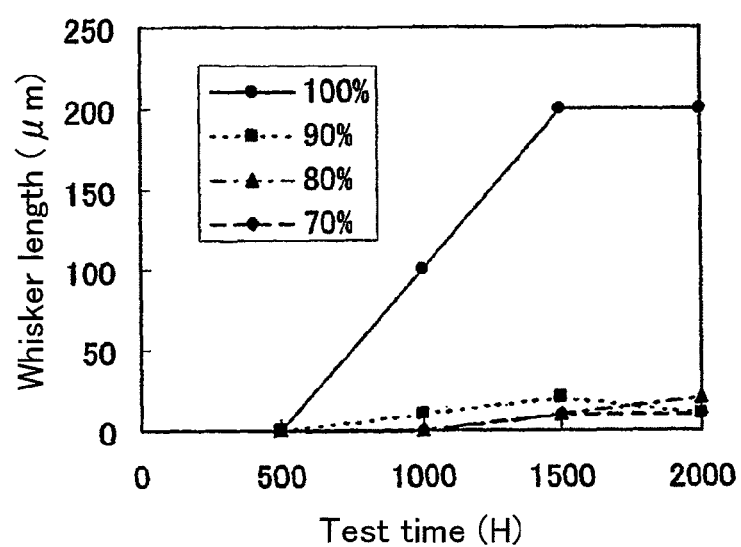
FIG. 4 is a graph showing the relationship between the whisker length and the elapsed time in the Examples.

The four different plating members obtained in Example 1 were subjected to a high-temperature and high-humidity test during which the members were left to stand in an environment of 85° C. and 85% RH for 2000 hours. Then, whisker formation and growth conditions (whisker length: "µm") were determined. The graph in FIG. 4 shows the results.

As shown in the graph in FIG. 4, in the case of the plating member D (plating particle volume fraction: 100%), whiskers grew to 200 µm in length 1500 hours later. However, in the case of each of the plating members A, B, and C of the present invention, the whisker length obtained 2000 hours later was approximately 40 µm or less. Thus, it is understood that a plating particle volume fraction of 90% or less results in sufficient whisker suppression effects.

Example 3

Figure 5:
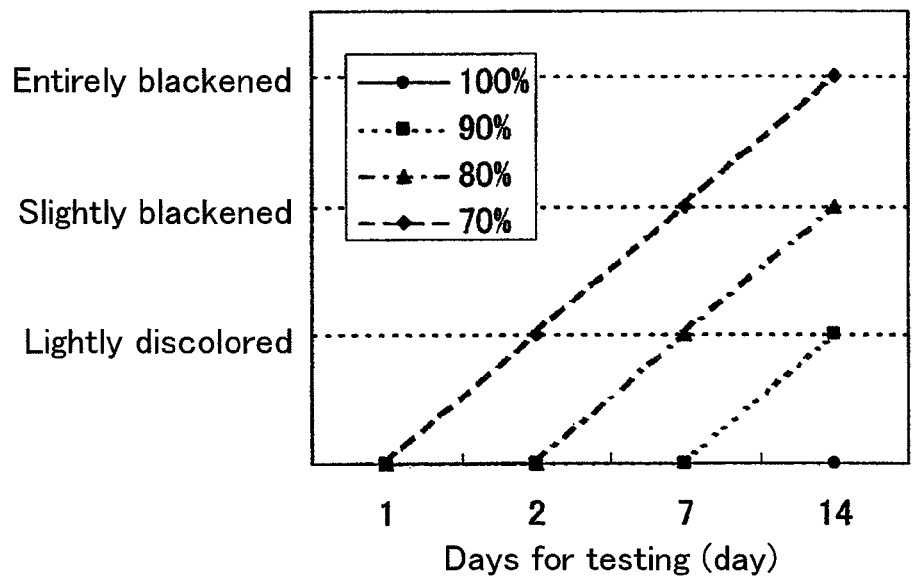
FIG. 5 is a graph showing the relationship between the surface discoloration condition and the number of days elapsed in the Examples.

The four different plating members obtained in Example 1 were left to stand at room temperature for 14 days, followed by observation of surface discoloration. The graph in FIG. 5 shows the results. It is understood that, the lower the plating particle volume fraction, the greater the extent of blackening, i.e., the progress of oxidation, in early days. In the case of the plating member D (plating particle volume fraction: 100%), no discoloration was substantially observed, even 14 days later.

Example 4

Figure 6:
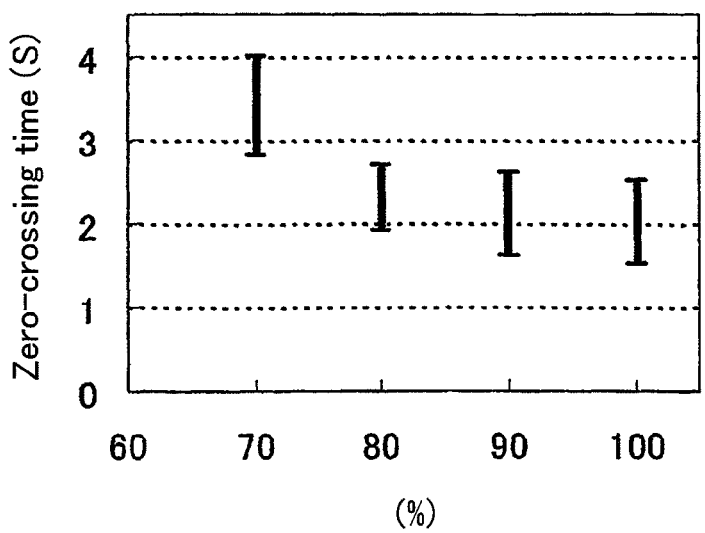
FIG. 6 is a graph showing the relationship between the plating particle volume fraction and the zero-crossing time of the plating member.

The progress of surface oxidation results in deterioration in solder wettability. Therefore, the four different plating members obtained in Example 1 were examined in terms of solder wettability (zero-crossing time) in accordance with JISC0053. The graph in FIG. 6 shows the results. It is said that the zero-crossing time is preferably 3 seconds or less for electronic components. FIG. 6 indicates that a plating particle volume fraction of less than 80% causes deterioration in solder wettability, possibly resulting in inconvenience for practical application. That is to say, when the plating particle volume fraction is 80% or more, required levels of solder wettability can be secured.

Consequently, it is understood that the plating member of the present invention has a plating particle volume fraction of preferably 80% to 90%.

The invention claimed is:

1. A plating member having, on the base material surface thereof, a plating layer comprising a lead-free material, characterized in that the plating layer has a layer structure of two or more layers, that the average particle diameter of plating particles constituting each layer varies from layer to layer, and that the plating particle volume fraction of the plating layer is less than 100% when the proportion of plating particles occupying a unit volume is defined as a plating particle volume fraction of 100% on the assumption that a unit volume is filled with plating particles each having the maximum average particle diameter,
   wherein the lead-free material is Sn or an Sn alloy, and
   wherein the plating member has a plating particle volume fraction of 80% to 90%.

2. The plating member according to claim 1, wherein a layer located farthest from a base material, which is one of the two or more layers, is a layer formed with plating particles each having the maximum average particle diameter.

3. The plating member according to claim 1, wherein the Sn alloy comprises one of Sn—Cu, Sn—Bi, and Sn—Ag.

4. The plating member according to claim 1, wherein the Sn alloy contains one of Cu, Bi, and Ag in a range of 1% to 7% by weight.

* * * * *